United States Patent
Seeber et al.

(10) Patent No.: US 10,031,198 B2
(45) Date of Patent: Jul. 24, 2018

(54) METHODS AND SYSTEMS FOR A DUAL WIND GRADIENT COIL

(71) Applicant: General Electric Company, Schenectady, NY (US)

(72) Inventors: Derek Allan Seeber, Florence, SC (US); Shahed Ashraf, Florence, SC (US); Fengshun Tan, Florence, SC (US); Sung Man Moon, Florence, SC (US)

(73) Assignee: General Electric Company, Schenectady, NY (US)

( * ) Notice: Subject to any disclaimer, the term of this patent is extended or adjusted under 35 U.S.C. 154(b) by 427 days.

(21) Appl. No.: 14/818,077

(22) Filed: Aug. 4, 2015

(65) Prior Publication Data

US 2017/0038444 A1    Feb. 9, 2017

(51) Int. Cl.
*G01R 33/00*    (2006.01)
*G01R 33/385*    (2006.01)

(52) U.S. Cl.
CPC ..... *G01R 33/3856* (2013.01); *G01R 33/3858* (2013.01)

(58) Field of Classification Search
CPC .............. G01R 33/385; G01R 33/3856; G01R 33/3804; G01R 33/3858; G01R 33/4215; G01R 33/422; G01R 33/3806; G01R 33/3815; G01R 33/3854; G01R 33/3875; G01R 33/3614; G01R 33/3802; G01R 33/56; G01R 33/34; G01R 33/34046; G01R 33/34076; G01R 33/3415; G01R 33/341; G01R 33/4808; G01R 33/283; G01R 33/3403; G01R 33/4822; G01R 33/34015; G01R 33/421; G01R 33/481; G01R 33/3692; G01R 33/3852; G01R 33/56509; A61N 2005/1055; A61N 1/403; A61N 2005/1094; A61N 2/004; A61N 5/1049; H01F 27/10; H01L 27/14601; H01L 27/14623
See application file for complete search history.

(56) References Cited

U.S. PATENT DOCUMENTS

| | | | |
|---|---|---|---|
| 5,574,373 A * | 11/1996 | Pausch | G01R 33/385 324/318 |
| 6,441,614 B1 * | 8/2002 | Edelstein | G01R 33/3856 324/307 |
| 7,339,376 B2 | 3/2008 | Liu | |
| 8,018,232 B2 | 9/2011 | Hollis | |
| 2013/0147476 A1 * | 6/2013 | Shvartsman | G01R 33/3875 324/309 |
| 2014/0184372 A1 | 7/2014 | Mathieu et al. | |
| 2014/0302258 A1 | 10/2014 | Mathieu et al. | |

* cited by examiner

*Primary Examiner* — Vinh Nguyen
(74) *Attorney, Agent, or Firm* — McCoy Russell LLP

(57) ABSTRACT

Methods and systems are provided for a gradient coil assembly. In one embodiment, a gradient coil assembly comprises a hollow, first gradient coil and a solid, second gradient coil co-wound with the first gradient coil. In this way, the turn density of the gradient coil assembly may be increased.

20 Claims, 4 Drawing Sheets

METHODS AND SYSTEMS FOR A DUAL WIND GRADIENT COIL

FIELD

Embodiments of the subject matter disclosed herein relate to non-invasive diagnostic imaging, and more particularly, to a dual wound gradient coil for magnetic resonance imaging systems.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field. When a human body, or part of a human body, is placed in the main magnetic field, the nuclear spins that are associated with the hydrogen nuclei in tissue water or fat become polarized. This means that the magnetic moments that are associated with these spins become preferentially aligned along the direction of the main magnetic field, resulting in a small net tissue magnetization along that axis. An MRI system also comprises components called gradient coils that produce smaller amplitude, spatially varying magnetic fields when a current is applied to them. Typically, gradient coils are designed to produce a magnetic field component that is aligned along the z-axis and that varies linearly in amplitude with position along one of the x, y, or z-axes. The effect of a gradient coil is to create a small ramp on the magnetic field strength and, in turn, on the resonant frequency of the nuclear spins along a single axis. Three gradient coils with orthogonal axes are used to "spatially encode" the MRI signal by creating a signature resonance frequency at each location in the body. Radio frequency (RF) coils are used to create pulses of RF energy at or near the resonance frequency of the hydrogen nuclei. The RF coils are used to add energy to the nuclear spins in a controlled fashion. As the nuclear spins then relax back to their rest energy state, they give up energy in the form of an RF signal. This signal is detected by the MRI system and is transformed into an image using a computer and know reconstruction algorithms.

The design of a gradient coil typically involves many compromises. For example, it is desirable to have a gradient coil that produces a highly linear magnetic field while using the smallest amount of current from a power supply. Additionally, gradient coils may necessitate cooling in order to avoid patient discomfort due to heat generation in the gradient coils. In some examples, gradient coils may be comprised of hollow wire in order to provide a conduit within the gradient coils for carrying coolant. To increase the strength of the magnetic field, it may be desirable to include a higher number of turns within a gradient coil. However, simply utilizing smaller diameter wire in the gradient coil increases resistance of the gradient coil and places additional load on the gradient coil current driver. Further, the inclusion of hollow gradient coils increases the diameter of the wire comprising the gradient coil and constrains the number of turns the coil is capable of including.

BRIEF DESCRIPTION

In one embodiment, a gradient coil assembly comprises a hollow, first gradient coil and a solid, second gradient coil co-wound with the first gradient coil. In this way, the turn density within the gradient coil assembly may be increased by including a second, solid gradient coil that may be of smaller overall dimension than the first, hollow gradient coil. In doing so, additional space that may otherwise be wasted within a hollow gradient coil may be utilized by the solid gradient coil, without using higher current within the gradient coil assembly. In some examples, the two gradient coils may be in thermal contact, either directly or via an insulating layer, such that cooling provided via coolant flowing through the hollow gradient coil may also cool the solid gradient coil.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 2:
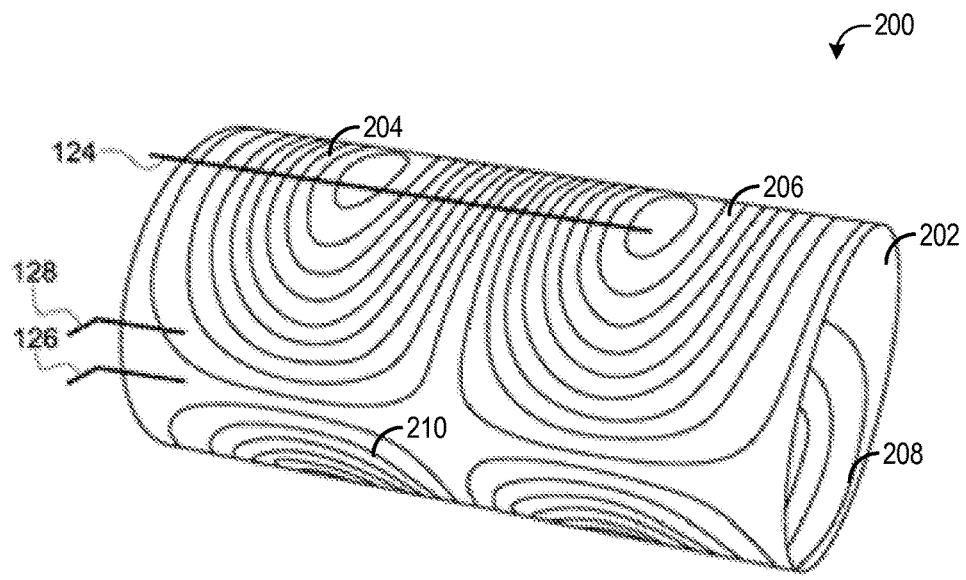
FIG. 2 shows a schematic illustration of an exemplary gradient board supporting a plurality of gradient coils according to an embodiment of the invention.
Figure 3:
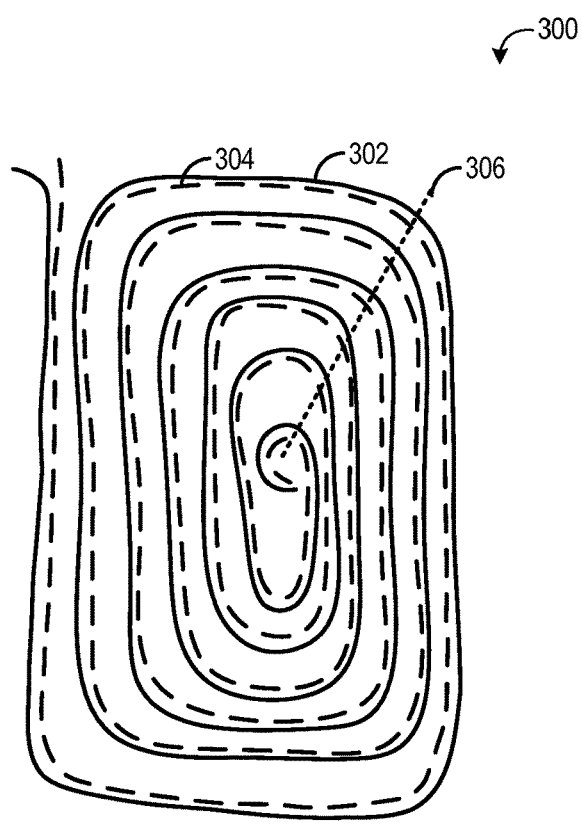
FIG. 3 shows a schematic illustration of example gradient coil assemblies according to an embodiment of the invention.
Figure 4:
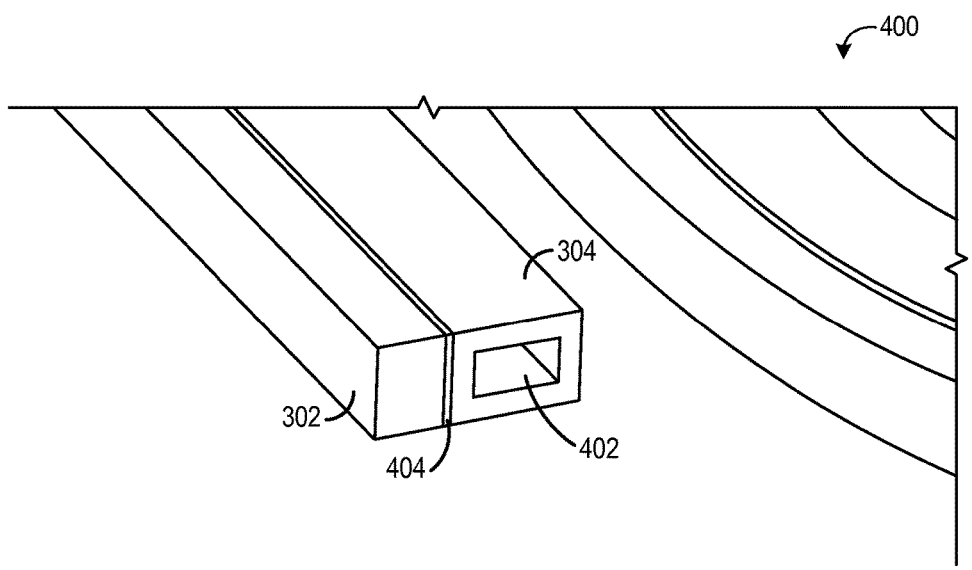
FIG. 4 shows a partial isometric view of an example gradient coil assembly.
Figure 5:
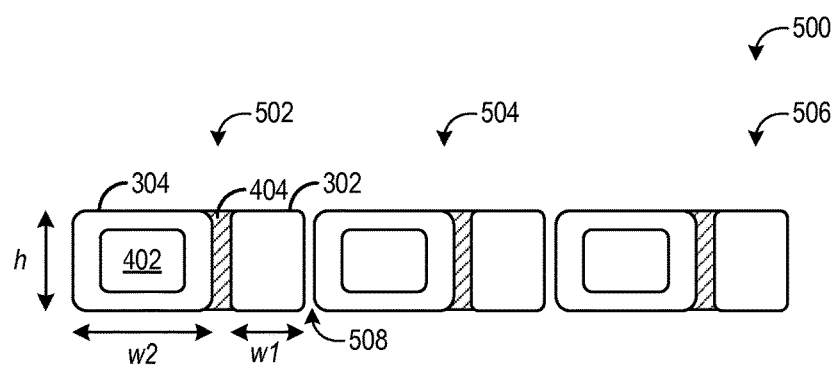
FIG. 5 shows a partial cross-section view of an example gradient coil assembly.
Figure 6:
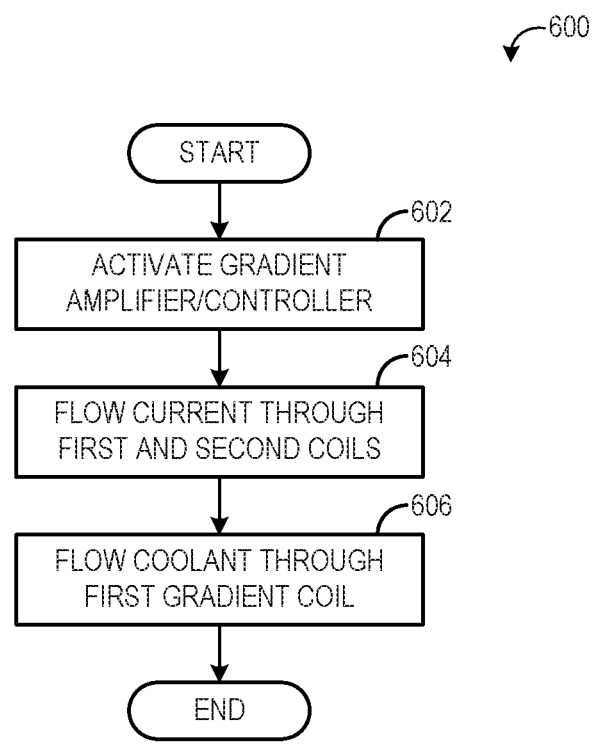
FIG. 6 shows a high-level flow chart illustrating an example method for a gradient coil assembly.

The following description relates to various embodiments of medical imaging systems. In particular, methods and systems are provided for a gradient coil assembly having increased turn density while maintaining sufficient cooling and minimizing increased current requirements. An example of a magnetic resonance imaging (MRI) system that may be used to acquire images is provided in FIG. 1. The MRI system of FIG. 1 may include one or more gradient coil assemblies arranged in cylindrical fashion to define an imaging volume, as illustrated in FIG. 2. An example gradient coil assembly comprised of a solid gradient coil and a hollow gradient coil is illustrated in FIGS. 3-5. A method for using such a gradient coil assembly during imaging of an imaging volume is shown in FIG. 6.

Figure 1:
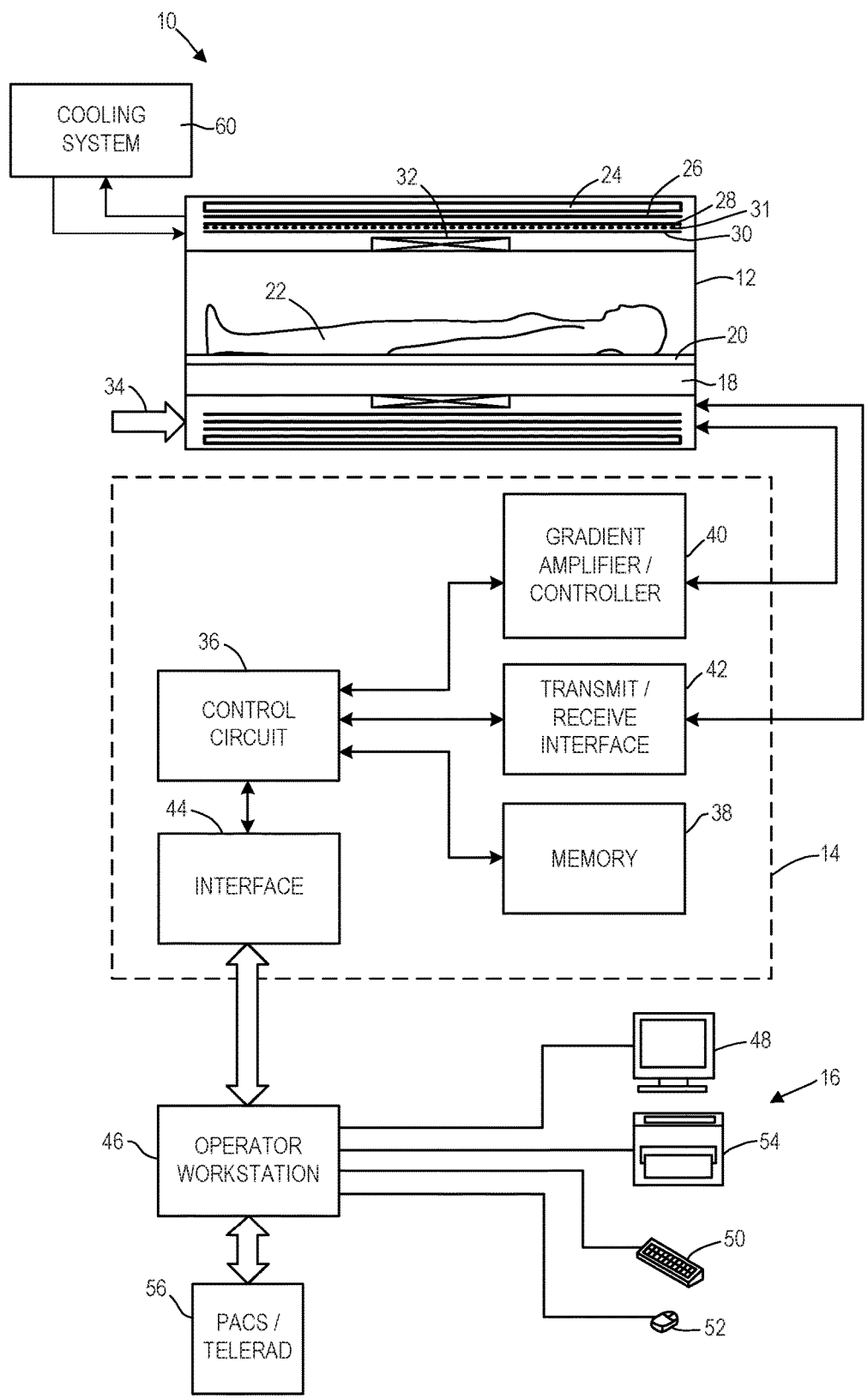
FIG. 1 shows a diagrammatical representation of an MRI system according to an embodiment of the invention.

Turning now to the drawings, and referring first to FIG. 1, a magnetic resonance imaging (MRI) system 10 is illustrated diagrammatically as including a scanner 12, scanner controller circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28, and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference number 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specially adapted for target anatomies, such as head coil assemblies, and so forth. Moreover, receiving coils may be provided in any suitable physical configuration, including phased array coils, and so forth.

In a present configuration, the gradient coils 26, 28, and 30 may be formed of conductive wires, bars, or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The gradient coils 26, 28, and 30 of the scanner 12 may be controlled by external circuitry to generate desired fields and pulses, and to read signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in a rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view.

The field may vary linearly in one direction, but may be homogeneous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

One or more shielding coils, such as shielding coil 31, may be present. The shielding coil 31 comprises turns of a conductive material configured to carry current in an opposite direction as a respective gradient coil, such as coil 30. Like the primary coil, the shielding coil includes a shielding x-coil, a shielding y-coil, and a shielding z-coil. The shielding coil 31 is configured to create a magnetic field that is substantially the opposite of the field created by the primary coil for regions outside of the shielding coil 31. For example, the shielding coil 31 is designed to minimize the stray fields from the primary coil that might otherwise induce eddy currents in other conducting structures, such as a cryostat (not shown). It is important to minimize the production of eddy currents in order to prevent the generation of time-varying magnetic fields that would otherwise negatively impact the performance of the MRI system.

The pulsed gradient fields may perform various functions integral to the imaging process. Some of these functions are slice selection, frequency encoding, and phase encoding. These functions can be applied along the x-, y-, and x-axes of the original coordinate system or along other axes determined by combinations of pulsed current applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phases differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radio frequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by gradient amplifier/controller 40 and by transmission and receive interface circuitry 42. The gradient amplifier/controller 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference number 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference number 56 in FIG. 1. Such devices may include picture archiving and communications systems (PACS), teleradiology systems (telerad), and the like.

Additionally, MRI system 10 may include a cooling system 60. The cooling system 60 may include one or more heat exchangers or chillers, a coolant pump, and coolant lines to flow coolant to one or more of the gradient coils. As will be described in more detail below, one or more gradient coils may be comprised of hollow wire and coupled to the cooling system such that coolant may flow through the hollow wire in order to provide direct cooling the gradient coil.

FIG. 2 shows a schematic diagram 200 of an example gradient board 202 supporting one or more gradient coils. The gradient board may include a fiberglass reinforced polymer or any other non-conductive durable material. The gradient board may be bent in order to form a substantially cylindrical bore. In some examples, the gradient board may be comprised of two or more separate boards joined together. As shown, four gradient coils are mounted to a surface of the gradient board, first gradient coil 204, second gradient coil 206, third gradient coil 208, and fourth gradient coil 210.

Also illustrated in FIG. 2 is an electrical connector 124, inlet connector 126 and outlet connector 128. In regard to the electrical connector 124, a dielectric spacer may be disposed onto the gradient coils prior to deposition of the electrical conductor 124 to prevent shorting between undesired portions of the coils and to enable a defined flow of current through the coils. Thus, the dielectric spacer electrically isolates the gradient coil from the electrical conductor 124, except at the points where electrical current is provided to and from the coils. The connectors 126 and 128 may be machined to include internal fluid paths, so as to enable the flow of the coolant into the hollow gradient coils, for example.

The gradient board and gradient coils may be oriented as illustrated in FIG. 2 to generate a y-axis gradient, where the magnetic field varies in the y-axis (e.g., top to bottom). Thus, the gradient board and coils illustrated in FIG. 2 may be one non-limiting example of how the gradient coil 30 of FIG. 1 may be configured. To generate an x-axis gradient, such as the gradient coil 28 of FIG. 1, where the magnetic field varies in x-axis (e.g., left to right), the gradient board and gradient coils may be rotated 90°. A z-axis gradient, such as the gradient coil 26 of FIG. 1, may comprise of varying magnetic field in the z-axis (e.g., along a length of the imaging volume). A z-axis gradient may be comprised of a gradient board and multiple gradient coils that are configured as Helmholtz coils as opposed to the double-saddle coil (also referred to as Golay coils) configuration illustrated in FIG. 2. In an MRI system, such as the system illustrated in FIG. 1, the gradient board 202 of FIG. 2 may be a radial inner-most board, surrounding by a second board comprising the x-axis gradient and a third board comprising the z-axis gradient, with additional shielding and/or RF coils disposed intermediate thereto.

FIG. 3 schematically illustrates an example gradient coil assembly 300. The gradient coil assembly 300 may be one non-limiting example of first coil 204, second coil 206, third coil 208, and/or fourth coil 210 of FIG. 2. Further, gradient coil assembly 300 may be included in an x-axis gradient coil and/or in a z-axis gradient coil. Gradient coil assembly 300 may include a first gradient coil 302 and a second gradient coil 304, which may be electrically coupled in series to each other. Each of the first and second gradient coils 302, 304 may be comprised of a suitable coil material, such as aluminum, copper, their respective alloys, or any other suitable conductive material, and may be wound into one or more desired coil geometries, such as curves, bends, varying angles and turning radii. Further, one or both of the first and second gradient coils may coated in enamel or other suitable material. As illustrated in FIG. 3, gradient coil assembly is comprised of twelve turns—six turns of the first gradient coil and six turns of the second gradient coil. The number of turns may be determined with respect to a suitable axis of the gradient coil assembly that traverses the length or width of the gradient coil assembly, such as axis 306. However, the number of turns is exemplary and other turn configurations are within the scope of this disclosure.

First and second gradient coils 302, 304 are co-wound with each other such that each gradient coil includes the same or substantially the same number of turns, turning radii, etc. To accomplish this, the first gradient coil may be attached to the second gradient coil along all or a portion of the length of the gradient coils prior to winding of the coils, and the two gradient coils may be wound into a final coil shape. In one example, the first gradient coil may be coupled to the second gradient coil via an insulating layer or other coupling mechanism along an entire length of the first gradient coil. However, in some examples the gradient coils may be co-wound without any direct or indirect coupling.

As used herein, "co-wound" may refer to two lengths of wire or other material that are wound together in a generally spiral or concentric manner to create a series of continuous concentric loops or coils. The two co-wound coils may lie on the same or substantially similar planes, such that both coils have equal vertical displacement with respect to a surface on which the assembly is mounted. As explained above with respect to FIG. 2, once the gradient coil assembly is assembled, it may be mounted on a cylindrical surface (e.g., of a gradient board). Thus, the gradient coil assembly may lie on a curved plane. Both the first and second gradient coils may lie on the same curved plane and same cylindrical surface.

In one example, first gradient coil 302 may be comprised of a solid wire while second gradient coil 304 may be comprised of a hollow wire. In other examples, first gradient coil 302 may be comprised of a hollow wire while second gradient coil may be comprised of a solid wire. By providing one hollow wire and one solid wire, the gradient coil assembly may have an increased number of turns relative to a gradient coil that is comprised of only hollow wire, while still providing sufficient cooling via coolant flow through the hollow wire. However, in some examples, both the first gradient coil and second gradient coil may be comprised of solid wire or both the first gradient coil and second gradient coil may be comprised of hollow wire.

FIG. 4 shows a partial isometric view 400 of the gradient coil assembly of FIG. 3. As shown in FIG. 4, the first gradient coil 302 is solid while the second gradient coil 304 is hollow, comprising a conduit 402 that extends the entire length of the second gradient coil. The first and second gradient coils are in thermal contact via an insulating layer 404 that may extend along the length of both the first and second gradient coils. The insulating material may be comprised of a suitable material, such as enamel, plastics, or other polymers. In the example illustrated in FIG. 4, the insulating layer is a separate material than the material comprising the first and second gradient coils, but in some examples the insulating layer may be a coating surrounding one or both of the gradient coils.

FIG. 5 shows a series of loops 500 of the gradient coil assembly in cross-section. Three loops, including a first loop 502, second loop 504, and third loop 506, each comprising two gradient coils are illustrated, however other numbers of loops are possible. Each loop includes a hollow gradient coil 304 coupled to a solid gradient coil 302 via the insulating layer 404, where the hollow coil includes a conduit 402. Between each loop is a space 508. Thus, as shown in FIG. 5, the gradient coil assembly, when viewed in cross-section along a suitable axis (such as axis 306 of FIG. 3), includes a first loop 502 comprised of a the first gradient coil 302 coupled to the second gradient coil 304 via the insulating layer 404. The first gradient coil may include a first inner wall in face-sharing contact with the insulating layer and a second outer wall that faces the space and does not contact any other components. Likewise, the second gradient coil may include a first inner wall in face-sharing contact with the insulating layer and second outer wall that faces a space, whether a space outside the coil assembly or a space within the coil assembly. The second loop 504 is comprised of the first and second gradient coils and insulating layer and is spaced apart from the first loop by a space 508, wherein nothing is disposed within the space. Each additional loop (e.g., loop 506) is the same as the loops described above.

As shown in FIG. 5, the first gradient coil has a width, depicted as w1, and a height h. The second gradient coil as a width w2 and a height h, which herein is the same height as the height of the first gradient coil. Accordingly, the first gradient coil has a cross-sectional area, w1×h, while the second gradient coil has a cross-sectional area, w2×h. The cross-sectional area of the second, hollow gradient coil may be larger than the first solid gradient coil. However, the conduit 402 within the second gradient coil is hollow, and thus the cross-section area of the second gradient coil that is comprised of solid material, e.g., the cross-section area of the second gradient coil excluding the conduit, is smaller than the overall cross-sectional area of the second gradient coil. In one example, the cross-sectional area of the solid gradient coil may be the same or substantially the same as the cross-section area of the hollow gradient coil excluding the area of the conduit. As used herein, "substantially the same" may include having the same value or having a value within a threshold, such as within 5 or 10%, of another value.

FIG. 6 is a flow chart illustrating a method 600 for a gradient coil assembly. In one example, the gradient coil assembly may the gradient coil assembly of FIGS. 3, 4, and/or 5, comprising of a solid wire in thermal contact with a hollow wire. At 602, method 600 includes activating a gradient amplifier/controller, such as the gradient amplifier/controller 40 of FIG. 1. When the gradient amplifier/controller is activated, current flows through the wires of the gradient coil assembly, thus generating a magnetic field. Accordingly, at 604, method 600 includes flowing current through the first and second gradient coils of the gradient coil assembly.

At 606, method 600 includes flowing coolant through the first gradient coil. As explained previously, one of the gradient coils, herein the first gradient coil, may be hollow and coupled to a cooling system. The cooling system is configured to flow coolant through the first gradient coil to cool the first gradient coil. Because the first gradient coil is in thermal contact with the second gradient coil, the second gradient coils is also cooled by the coolant flowing through the first gradient coil. However, because the second gradient coil is solid, coolant does not flow through the second gradient coil. Method 600 then ends.

Thus, the gradient coil assembly described herein provides for a hybrid gradient coil where a hollow conductor and a solid conductor are co-wound. The pair of wires may have a width of less than 2× the width of the hollow conductor alone, allowing more turns in the constrained size of the gradient coil. The hollow conductors and solid conductor may be connected in series. As an example, this configuration may allow a space constrained gradient of hollow wire at 25 turns to go to a hybrid configuration at 30 turns with half solid and half hollow. This would represent a 20% increase in the number of turns in the space size gradient coil. The hybrid gradient coil assembly may have the hollow and solid wires touching for maximum heat removal ability. At least one of the conductors may be enameled to prevent shorts.

By providing a hybrid gradient coil assembly having a solid wire co-wound with a hollow wire, increased turn density may be achieved. The gradient driver may be designed to provide additional voltage and not current, and thus could still enable higher gradient strengths without increasing current. Additionally, less hollow conductor may be present in the gradient coil, which may lower costs. Further, pressure drop of the coolant may decrease for identical flow rates due to the decreased length of the hollow conductor.

The hybrid gradient coil assembly described herein may be included as one or more coils of an x-axis gradient, y-axis gradient, or z-axis gradient. In some MRI systems, the x-axis, y-axis, and/or z-axis gradients may be comprised of more than one coil, such as four coils or eight coils. In such examples, any one or more of the coils may be comprised of the hybrid coil assembly described herein. For example, an x-axis gradient may comprise four inner coils and four outer coils. The four inner coils may be comprised of the hybrid coil assemblies of the disclosure while the four outer coils may be comprised of only solid wire. Other configurations are within the score of the disclosure.

A technical effect of the disclosure is increased magnetic field gradient strength without increasing the load placed on the gradient driver.

In one embodiment, a gradient coil assembly comprises a hollow, first gradient coil; and a solid, second gradient coil co-wound with the first gradient coil. In an example, the first and second gradient coils are coupled in series. In an example, the first and second gradient coils are each configured to couple to a gradient coil driver configured to supply current to the first and second gradient coils. In an example, the first gradient coil is configured to couple to a cooling system configured to supply a coolant flow through the first gradient coil. In an example, the first gradient coil and second gradient coil are each in face-sharing contact with an insulating layer along a length of each of the first and second gradient coils. In an example, the first and second gradient coils are each located on a plane that forms a cylindrical surface. In an example, the first gradient coil has a first cross-sectional area, and the second gradient coil has a second, smaller cross-sectional area. In a further example, the first gradient coil comprises solid portion surrounding a hollow conduit, and the solid portion of the first gradient coil has a third cross-sectional area that is equal to the second cross-sectional area. In an example, one or more of the first and second gradient coils is insulated.

An embodiment of a Magnetic Resonance Imaging (MRI) system comprises a gradient coil assembly disposed cylindrically around an imaging volume, the gradient coil assembly including a first gradient coil co-wound with a solid, second gradient coil, the first gradient coil having a central conduit; a gradient driver coupled to the gradient coil assembly and configured to deliver pulse sequences to the gradient coil assembly; and a cooling system coupled to the gradient coil assembly and configured to deliver coolant to the central conduit of the first gradient coil. In an example the MRI system further comprises a main magnet and a radiofrequency (RF) coil. In an example, the MRI system further comprises a shielding coil disposed cylindrically around the imaging volume and adjacent the gradient coil assembly. In an example, the first gradient coil and second gradient coil are each in face-sharing contact with an insulating layer along a length of each of the first and second gradient coils. In an example, the first gradient coil is coated in an insulating material, and the second gradient coil is in face-sharing contact with the insulating material.

An embodiment of a method comprises flowing current through a first gradient coil and a second gradient coil to generate a controlled magnetic gradient field along an axis of an imaging volume, the first gradient coil and second gradient coil each in face-sharing contact with a common insulating layer, the first gradient coil, second gradient coil, and insulating layer wound into a series of continuous and concentric loops; and flowing coolant through a conduit of the first gradient coil to cool the first gradient coil and the second gradient coil, the second gradient coil in thermal contact with the first gradient coil. In an example, flowing current through the first gradient coil and second gradient coil comprises activating a gradient driver to deliver pulse sequences to the first gradient coil and the second gradient coil. In an example, flowing current through the first gradient coil and second gradient coil comprises flowing current through the first gradient coil and the second gradient coil in series. In an example, flowing coolant through the first gradient coil comprises pumping coolant from a cooling system to the central conduit of the first gradient coil. In an example, the magnetic gradient field is generated along an x-axis of the imaging volume. In an example, the magnetic gradient field is generated along a y-axis of the imaging volume.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A gradient coil assembly, comprising:
a hollow, first gradient coil; and
a solid, second gradient coil co-wound with the first gradient coil, the first gradient coil co-planar with the second gradient coil.

2. The gradient coil assembly of claim 1, wherein the first and second gradient coils are coupled in series, and wherein the first gradient coil being co-planar with the second gradient coil comprises, at any point along the gradient coil assembly, the first gradient coil and the second gradient coil being located on a same plane at that point.

3. The gradient coil assembly of claim 1, wherein the first and second gradient coils are each configured to couple to a gradient amplifier/controller configured to supply current to the first and second gradient coils, and wherein the first gradient coil being co-wound with the second gradient coil includes the gradient coil assembly having alternating loops of the first gradient coil and the second gradient coil.

4. The gradient coil assembly of claim 1, wherein the first gradient coil is configured to couple to a cooling system configured to supply a coolant flow through the first gradient coil.

5. The gradient coil assembly of claim 1, wherein the first gradient coil and second gradient coil are each in face-sharing contact with an insulating layer along a length of each of the first and second gradient coils.

6. The gradient coil assembly of claim 1, wherein all loops of the first gradient coil are coupled to a surface and all loops of the second gradient coil are coupled to the surface, and wherein the surface is a cylindrical surface.

7. The gradient coil assembly of claim 1, wherein the first gradient coil has a first cross-sectional area, and wherein the second gradient coil has a second, smaller cross-sectional area, wherein all loops of the first gradient coil are coupled to a surface and all loops of the second gradient coil are coupled to the surface, and wherein the surface is a flat surface such that all loops of the first gradient coil and all loops of the second gradient coil are located on a same plane.

8. The gradient coil assembly of claim 7, wherein the first gradient coil comprises a solid portion surrounding a hollow conduit, and wherein a portion of the first cross-sectional area that is comprised of the solid portion of the first gradient coil corresponds to a third cross-sectional area that is equal to the second cross-sectional area.

9. The gradient coil assembly of claim 1, wherein one or more of the first and second gradient coils is insulated.

10. A Magnetic Resonance Imaging (MRI) system comprising:
a gradient coil assembly disposed cylindrically around an imaging volume, the gradient coil assembly including a first gradient coil co-wound with a solid, second gradient coil, the first gradient coil having a central conduit, and the first gradient coil and the second gradient coil collectively forming a series of continuous concentric loops;
a gradient amplifier/controller coupled to the gradient coil assembly and configured to deliver pulse sequences to the gradient coil assembly; and
a cooling system coupled to the gradient coil assembly and configured to deliver coolant to the central conduit of the first gradient coil.

11. The MRI system of claim 10, further comprising a main magnet and a radiofrequency (RF) coil, and wherein the series of concentric loops comprises a first loop of the co-wound first gradient coil and second gradient coil, a second loop of the co-wound first gradient coil and second gradient coil, and a third loop of the co-wound first gradient coil and second gradient coil, the third loop concentric with the second loop and the second loop concentric with the first loop, and wherein, along a first axis of the gradient coil assembly, the second loop is located intermediate the first loop and the third loop.

12. The MRI system of claim 10, further comprising a shielding coil disposed cylindrically around the imaging volume and adjacent the gradient coil assembly, and wherein the gradient coil assembly includes a surface on which the first gradient coil and second gradient coil are mounted, and wherein the first gradient coil and the second gradient coil have equal vertical displacement relative to the surface at each point of gradient coil assembly along an entire length of each of the first gradient coil and second gradient coil.

13. The MRI system of claim 10, wherein the first gradient coil and the second gradient coil are each in face-sharing contact with an insulating layer along an entire length of each of the first gradient coil and the second gradient coil.

14. The MRI system of claim 10, wherein the first gradient coil is coated in an insulating material, and wherein the second gradient coil is in face-sharing contact with the insulating material, and wherein the insulating material comprises a polymer material.

15. A method, comprising:
flowing current through a first gradient coil and a second gradient coil to generate a controlled magnetic gradient field along an axis of an imaging volume, the first gradient coil and the second gradient coil each in face-sharing contact with a common insulating material, the first gradient coil, the second gradient coil, and the insulating material all wound into a single series of continuous and concentric loops; and
flowing coolant through a conduit of the first gradient coil to cool the first gradient coil and the second gradient coil, the second gradient coil in thermal contact with the first gradient coil.

16. The method of claim 15, wherein flowing current through the first gradient coil and the second gradient coil comprises activating a gradient amplifier/controller to deliver pulse sequences to the first gradient coil and the second gradient coil.

17. The method of claim 15, wherein flowing current through the first gradient coil and the second gradient coil comprises flowing current through the first gradient coil and the second gradient coil in series.

18. The method of claim 15, wherein flowing coolant through the first gradient coil comprises pumping coolant from a cooling system to the conduit of the first gradient coil.

19. The method of claim 15, wherein the magnetic gradient field is generated along an x-axis of the imaging volume.

20. The method of claim 15, wherein the magnetic gradient field is generated along a y-axis of the imaging volume.

* * * * *